United States Patent [19]

Motoyama

[11] Patent Number: 5,403,438
[45] Date of Patent: Apr. 4, 1995

[54] PROCESS FOR FORMING PATTERN

[75] Inventor: Takushi Motoyama, Kawasaki, Japan

[73] Assignee: Fujitsu Limited, Kawasaki, Japan

[21] Appl. No.: 223,327

[22] Filed: Apr. 5, 1994

Related U.S. Application Data

[63] Continuation of Ser. No. 818,900, Jan. 10, 1992, abandoned.

[30] Foreign Application Priority Data

Jan. 10, 1991 [JP] Japan .................................. 3-001309

[51] Int. Cl.6 .......................................... H01L 21/312
[52] U.S. Cl. .................. 156/660; 156/661.1; 156/659.1
[58] Field of Search .................. 156/661.1, 659.1, 660

[56] References Cited

U.S. PATENT DOCUMENTS

| | | | |
|---|---|---|---|
| 4,244,799 | 1/1981 | Fraser et al. | 156/659.1 |
| 4,589,952 | 5/1986 | Behringer et al. | 156/661.1 |
| 4,747,909 | 5/1988 | Kanazawa et al. | 156/661.1 |
| 4,790,903 | 12/1988 | Sugano et al. | 156/661.1 |
| 5,045,150 | 9/1991 | Cleeves et al. | 156/661.1 |
| 5,169,494 | 12/1992 | Hashimoto et al. | 156/661.1 |

OTHER PUBLICATIONS

S. Wolf, *Silicon Processing for the VLSI Era*, vol. 1, Lattice Press, Sunset Beach, Calif., 1986, pp. 423–4.

*Primary Examiner*—Brian E. Hearn
*Assistant Examiner*—Trung Dang
*Attorney, Agent, or Firm*—Staas & Halsey

[57] ABSTRACT

A process for forming a pattern, which includes forming a first resist layer on an article to be fabricated, which article is formed over a substrate, forming a mask layer of Spin On Glass, for etching the first resist layer, on the first resist layer, patterning the mask layer, selectively etching the first resist layer by using the mask layer as a mask, removing the patterned mask layer, by an etching process, selectively etching the article to be fabricated by using the etched first resist layer as a mask, and removing the etched first resist layer to thus form a predetermined pattern.

6 Claims, 6 Drawing Sheets

PROCESS FOR FORMING PATTERN

This application is a continuation of application Ser. No. 07/818,900, filed Jan. 10, 1992, now abandoned.

BACKGROUND OF THE INVENTION

1. Field of the Invention

The present invention relates to a process for forming a pattern.

More particularly, the present invention relates to a process for forming a pattern in which a thin film on a substrate is etched by using a resist film formed by a multi-layer process as a mask, to thus form a pattern, followed by removing the mask.

2. Description of the Related Art

Due to the necessity for treating a large amount of information at a high speed on an integrated semiconductor device, which plays a main role in an information treating device, large-scale integrated circuits (LSI) and very large-scale integrated circuits (VLSI) have been developed and are now in practical use.

Recently, the demand for the precise forming of a fine pattern has greatly increased, accompanied by a fine-forming of a minimum design rule for LSI's and VLSI's.

To meet this demand, the multi-layer resist process has attracted attention as a replacement for a prior mono-layer resist process now widely employed.

A resist pattern formed by the multi-layer resist process has the following merits. For example, the usable focus range of the resist can be widened because the exposure is carried out after a leveling of the differences in the level of the substrate, by using the resist layer, and the patterning controllability is superior because the patterning is carried out by using an anisotropic etching process. Due to these merits, this multi-layer resist process is considered to have great possibilities in the field of manufacturing semiconductor devices, and this process is now proving to be an effective resist pattern process for obtaining half-micron patterns.

In the etching process, wherein the resist formed by the former multi-layer resist process is used as a mask, the formed multi-layer resist is used as is, followed by etching each kind of material to be etched.

For example, the resist layer having a silicon-containing layer thereon was used as a mask in the etching step.

In the etching of the material to be etched, however, by using the formed resist layer as is, for example, when a thick silicon oxide layer or a thin aluminium alloy layer is to be etched, a mask layer such as a silicon-containing layer formed on a relatively thinner resist layer than the above-mentioned silicon oxide layer, or the aluminium alloy thin layer, is simultaneously removed by etching during the etching of the silicon oxide. Therefore, the remaining resist layer is composed of only an organic component, and thus no problem arises in an ashing of the resist by means of an oxygen plasma or oxygen downstream.

Nevertheless, if the etching rate for the mask layer such as the silicon-containing layer is low, when polycrystalline silicon (poly Si), tungsten (W), tungsten silicide (W Si$_2$) or the like is to be etched, or if the thin layer to be etched is not thick enough, a part of the mask layer such as a silicon-containing layer formed on the resist layer remains after the etching of the thin layer.

This part of the mask layer such as a silicon-containing layer is adhered to the substrate in the ashing process of the resist layer as dust, and this has an adverse influence on the manufacturing yield of LSI's. This is because, when forming a thin layer on a patterned substrate, the dust forms unwanted projections or holes in the thin layer and prevents the thin layer from tightly adhering to the substrate.

SUMMARY OF THE INVENTION

A primary object of the present invention is to provide a process for forming a pattern, this process eliminating the influence of a mask layer, such as the silicon-containing layer, and preventing a lowering of the manufacturing yield of articles due to the dust.

As shown in FIG. 1, the present process is characterized by comprising the steps of:
forming a first resist layer (3) on an article to be fabricated (2), which is formed on a substrate (1),
forming a mask (4) layer on the first resist layer (3),
patterning the mask layer,
selectively etching the first resist layer (3) by using the patterned mask layer (4) as a mask (FIG. 1A),
removing the patterned mask layer (4) by etching (FIG. 1B),
selectively etching the article to be fabricated (2) by using the etched first resist layer (3) as a mask (FIG. 1C), and
removing the etched first resist layer (3) to form a predetermined pattern (FIG. 1D).

As described above, in the present invention, the substrate is etched after removing the mask layer on the first resist layer, and thus any resist remaining at the ashing of the resist is composed only of organic components. Therefore, the ashing process can be carried out without the presence of dust, and thus the manufacturing yield of LSI's or VLSI's can be increased.

DESCRIPTION OF THE PREFERRED EMBODIMENTS

As described above, the novelty of the present invention lies in the step of removing the patterned mask layer by etching, before the step of selectively etching the article to be fabricated.

By applying a new step to the prior process, the previously mentioned defects can be avoided.

The present process can be applied to a multi-layer resist process, such as a two-layer or three-layer resist process.

In the present invention, the first resist layer can be composed of a positive-working photo resist such as novalac resin, or a negative-working photo resist, or a positive-working electron beam resist such as poly methyl acrylate (PMMA), or a negative-working electron beam resist such as poly chloromethyl stylene (CMS) and poly methylsilsesquioxane (PMSS).

The mask layer used for etching the first resist layer can be composed for example, of a silicon-containing layer such as a Spin On Glass (SOG) layer, titanium-containing polymer, tungsten oxide or the like.

The second resist layer can be composed, for example, of the same type as or a different type than the first resist layer.

Concretely, a novalac resist, polymethacryl acid methyl ester (PMMA) or chloromethyl polystyrene (CMS) can be used as the second resist layer.

The present invention will be further described with reference to be following examples.

EXAMPLE 1

This example illustrates an embodiment of the present process when applied to a triple-layer structure as shown in FIGS. 2A–2I.

A novalac resist (OFPR-800; supplied by Tokyo Oka Co., Ltd.) was coated over a silicon substrate 5 coated with a polysilicon layer 7 of a thickness of 0.3 μm, then heated on a hot plate at a temperature of 200° C., to thus form the first resist layer 8 (FIG. 2A) having a thickness of 2 μm. Note, numeral 6 in FIG. 2 denotes the silicon oxide layer.

Figure 1A:
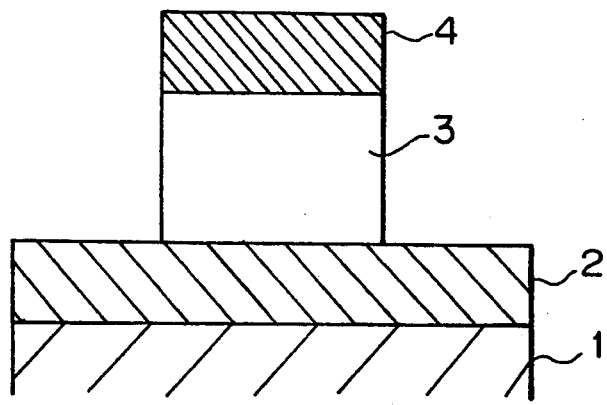
FIG. 1A through FIG. 1D are sectional views illustrating the principle of the present invention.
Figure 1B:
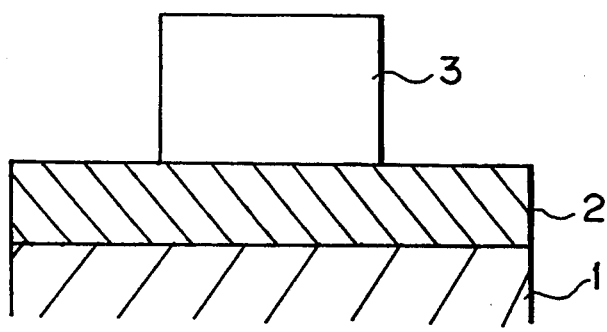
Figure 1C:
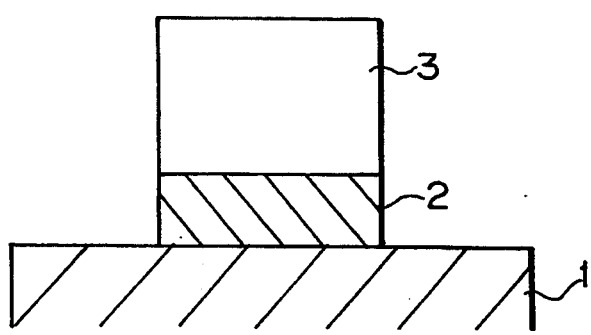
Figure 1D:
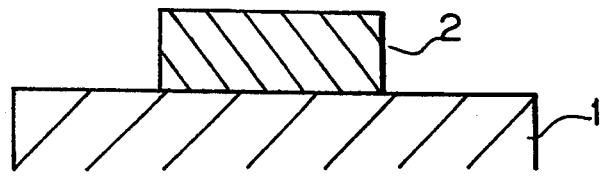
Figure 2A:
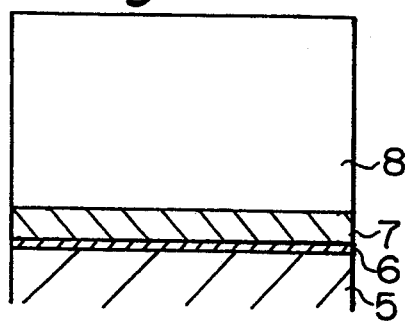
FIG. 2A through FIG. 2I are sectional views illustrating a sequence of steps in one embodiment of the present invention.
Figure 2B:
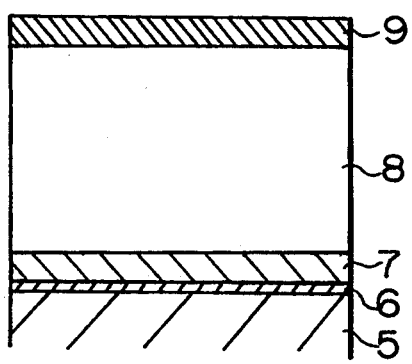
Figure 2C:
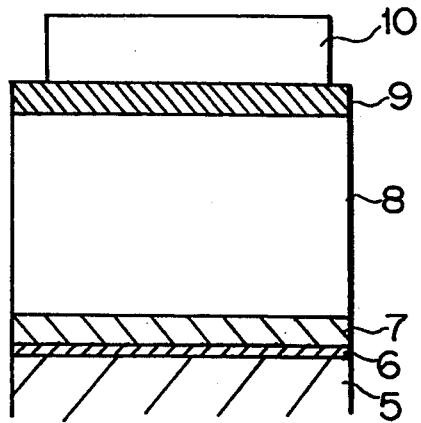

Next, SOG (OCD-type 7; manufactured by Tokyo Oka Co., Ltd.) was coated on the first resist layer 8 to a thickness of 0.3 μm, to form a mask layer 9 (FIG. 2B).

Figure 2D:
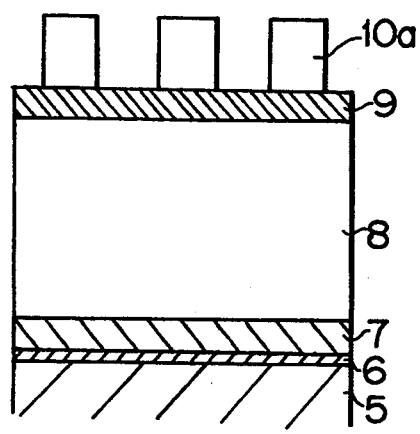

Then, a novalac resist (OFPR-800) was coated on the mask layer 9 to a thickness of 0.5 μm, to form the second resist layer 10 (FIG. 2C), followed by an exposure using a high pressure mercury lamp (g-line), and developing to form a patterned second layer 10a (FIG. 2D).

Figure 2E:
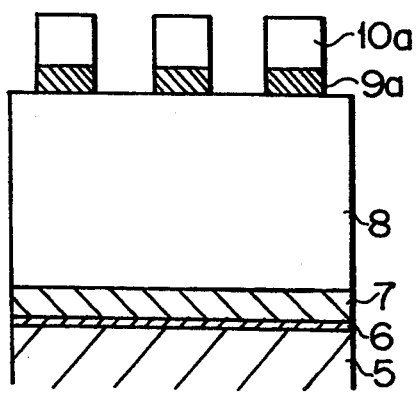

Then, the mask layer 9 was patterned by anisotropic etching using a parallel-plane type RIE, while using the patterned second layer 10a as a mask, to form a patterned mask layer 9a (FIG. 2E).

In this etching step, a mixture of tetrafluoromethane ($CF_4$) and trifluoromethane ($CHF_3$) was used as a etching gas, and the RF power was 300 W.

Figure 2F:
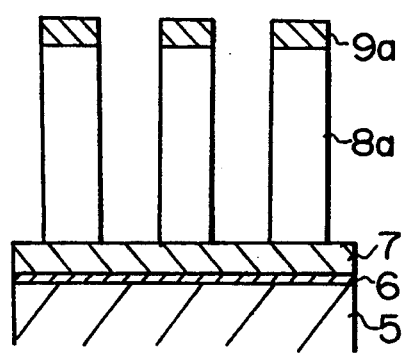

Next, the first resist layer 8 was anisotropically etched by an ECR plasma-assisted etching and an oxygen gas, to thus form a patterned first resist layer 8a carrying the patterned mask layer (the patterned SOG layer) 9a thereon (FIG. 2F). Note, during this step, the patterned second resist layer 10a also was removed.

Figure 2H:
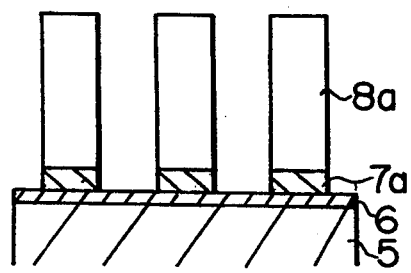
Figure 2G:
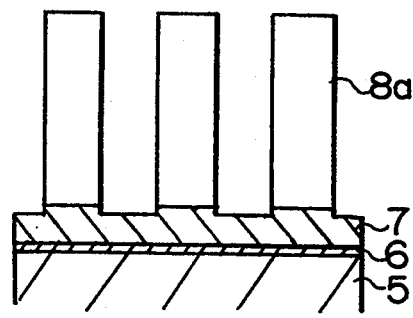

Next, as shown in FIG. 2G, the patterned mask layer 9a was removed by the parallel-plate type RIE apparatus, while using trifluoromethane as the etching gas.

In this step, the etching ratio between the patterned mask layer (SOG layer) 8a and the layer to be fabricated (polysilicon layer) 7 is about five to one, under a pressure of 0.15 torr and an RF power of 300 W.

Therefore, the layer to be fabricated 7 is etched only during the above etching step.

Next, the layer to be fabricated (polysilicon layer) 7 and formed over the substrate 5 was anisotropically etched by the parallel-plate type RIE apparatus with bromotrifluoromethane ($CBrF_3$), to obtain a patterned layer 7a (FIG. 2H).

Figure 2I:
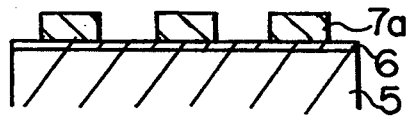

Finally, the first resist pattern 8a was ashed and removed with an oxygen downstream, while heating the substrate to a temperature of 150° C., to thus obtain the predetermined pattern 7a (FIG. 2I).

No dust was found on the surface of the silicon oxide layer 6.

EXAMPLE 2

This example illustrates an another embodiment of the present invention when applied to a double-layer structure as shown in FIGS. 3A–3G.

Figure 3A:
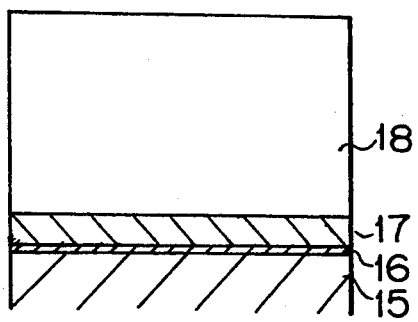
FIG. 3A through FIG. 3G are sectional views illustrating a sequence of steps in another embodiment of the present invention; and, FIG. 4A through FIG. 4F are sectional views illustrating a sequence of steps in a comparative Example.

A novalac resist (OFPR-800 supplied by Tokyo Oka Co., Ltd.) was coated over a silicon substrate 15 coated with a polysilicon layer 17 having a thickness of 0.3 μm, and then heated on a hot plate at a temperature of 200° C., to thus form a first resist layer 18 having a thickness of 2 μm (FIG. 3A).

This resist layer 18 is not soluble by an organic solvent. Note, numeral 16 in FIG. 3 denotes the silicon oxide layer.

Figure 3B:
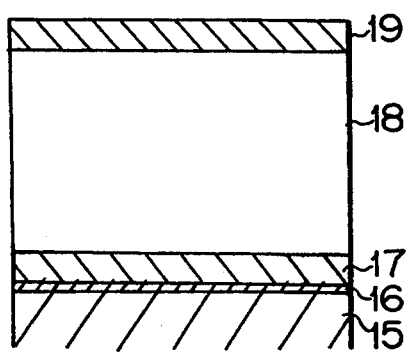

Next, polymethylsilsesquioxane (PMSS) (manufactured by Fujitsu Limited) was coated on the first resist layer 18 to a thickness of 0.3 μm, to thus form a mask layer 19 (FIG. 3B).

Figure 3C:
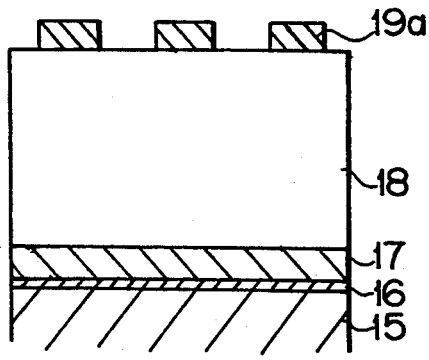

Next, the mask layer 19 was exposed by using a electron-beam exposing system, followed by developing, to obtain a negative-working resist pattern 19a (FIG. 3C).

Figure 3D:
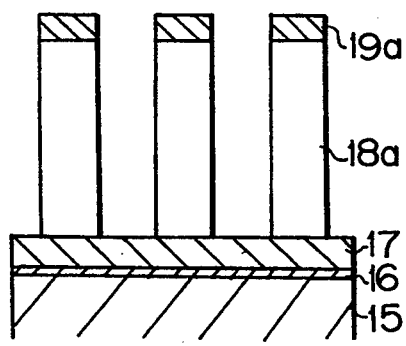

Next, the first resist layer 18 was anisotropically etched with oxygen gas by an ECR plasma-assisted etching, while using the negative-working resist pattern 19a as a mask, to obtain a patterned first resist layer 18a carrying the resist pattern 19a thereon (FIG. 3D).

Figure 3E:
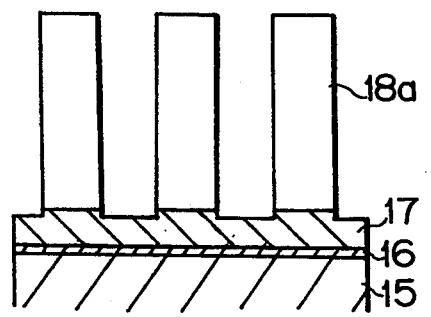

Next, as shown in FIG. 3E, the resist pattern 19a was removed by the parallel-plate type RIE apparatus (0.15 torr, 300 W), while using trifluoromethane as the etching gas.

In this step, the etching ratio between the resist pattern 19a and the layer to be fabricated (polysilicon layer) 17 was about five to one, under a pressure of 0.15 torr and RF power of 300 W.

Figure 3F:
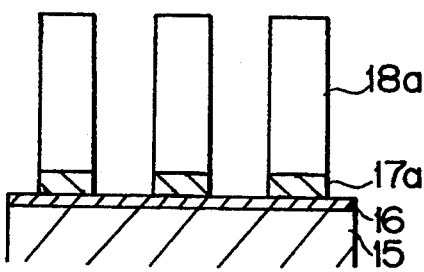

Next, the layer to be fabricated (polysilicon layer) 17 and formed over the substrate 15 was anisotropically etched by the parallel-plate type RIE apparatus with bromotrifluoromethane ($CBrF_3$), to thus obtain a patterned layer 17a (FIG. 3F).

Figure 3G:
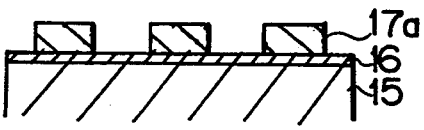

Finally, the first resist pattern 18a was ashed and removed with oxygen downstream, while heating the substrate 15 to a temperature of 150° C., to thus obtain the predetermined pattern 17a (FIG. 3G).

No dust was found on the surface of the silicon oxide layer 16.

Comparative Example

This example illustrates the results of a comparative example carried out in accordance with a prior art process as shown in FIGS. 4A–4F.

A novalac resist (OFPR-800; supplied by Tokyo Oka Co., Ltd.) was coated over a silicon substrate 31 coated with a polysilicon layer 32 having a thickness of 0.3 μm, and then heated on a hot plate to a temperature of 200° C., to thus form the lower resist layer 33. Numeral 31A in FIGS. 4A–4F denotes a silicon oxide layer.

Next, SOG (OCD-type 7; supplied by Tokyo Oka Co., Ltd.) was coated on the lower resist layer 33 to a thickness of 0.3 μm, to thus form a middle resist layer 34.

Figure 4A:
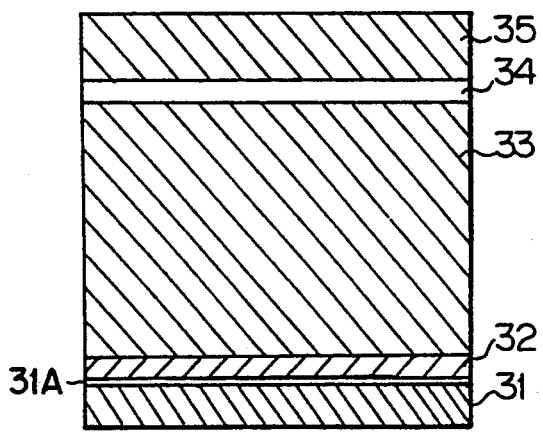

The novalac resist (OFPR-800) was coated on the middle resist layer 34 to a thickness of 0.5 μm, to thus form an upper resist layer 35 (FIG. 4A).

Next, the upper resist layer 35 was exposed by using a high pressure mercury lamp (g-line), and developing to form a positive-working upper resist pattern 35a.

Figure 4B:
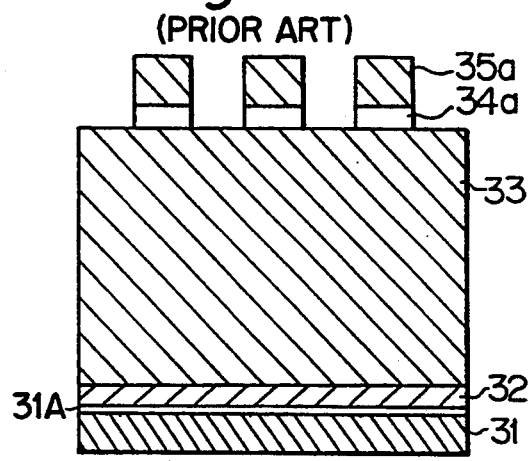

Then the middle resist layer 34 was patterned by anisotropic etching using a parallel-plane type RIE equipment, while using the patterned upper resist layer 35 as a mask, to thus form a patterned middle resist layer 34a (FIG. 4B).

In this etching step, a mixture of tetrafluoromethane (CF$_4$) and trifluoromethane (CHF$_3$) was used as the etching gas and the RF power was 300 W.

Figure 4C:
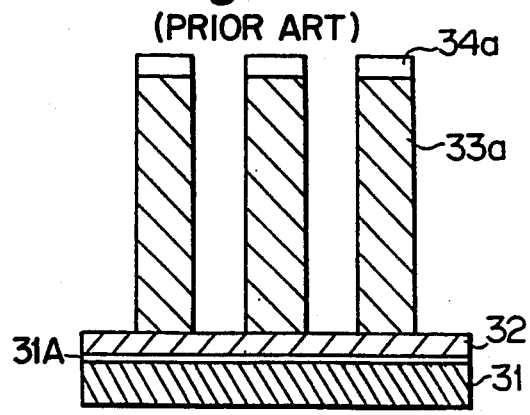

Next, the lower resist layer 33 was anisotropically etched by an ECR plasma-assisted etching and an oxygen gas, to thus form a patterned lower resist layer 33a carrying the patterned middle resist layer (the patterned SOG layer) 34a thereon (FIG. 4C). Note, the upper resist pattern 35a also was removed during this step.

Figure 4D:
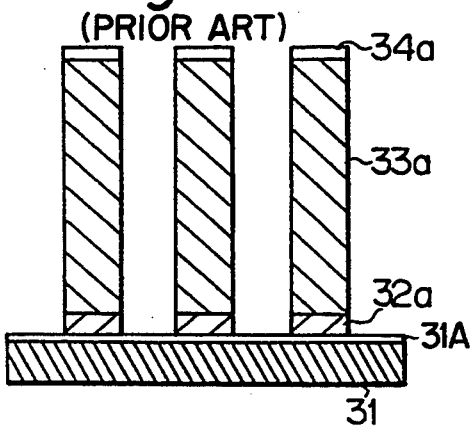

Next, polysilicon layer 32 formed over the substrate 31 was anisotropically etched by parallel-plate type RIE apparatus with bromotrifluoromethane (CBrF$_3$), to thus obtain a patterned polysilicon layer 32a (FIG. 4D).

Figure 4E:
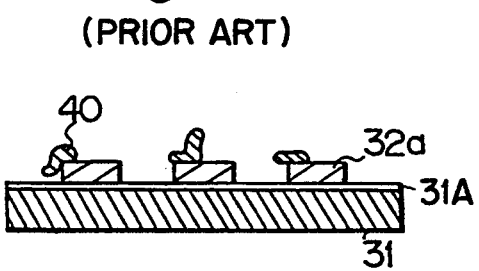
Figure 4F:
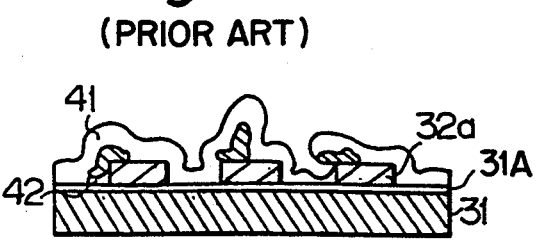

Finally, the lower resist pattern 33a was ashed and removed with an oxygen downstream, while heating the substrate to a temperature of 150° C., to thus obtain the polysilicon pattern 32a (FIG. 4E).

During this process, the patterned SOG layer 34a loaded on the lower resist layer 33a was removed by lift-off, but a part of the removed SOG layer was adhered to the substrate 31 or the polysilicon pattern 32a as dust 40.

When forming a thin layer 41 over the substrate 31, an abnormal figure-pattern was obtained due to the forming of unwanted protrusions, a poor adhesion of the thin layer to the substrate, or the forming of holes 42.

I claim:

1. A process for forming a pattern, which comprises the steps of:

forming a first resist layer on an article to be fabricated, which article is formed over a substrate, forming a mask layer consisting of Spin On Glass (SOG) on the first resist layer, patterning the mask layer, selectively etching the first resist layer by using the mask layer as a mask, removing the mask layer by an etching process prior to selective etching of the article to the fabricated, selectively etching the article to be fabricated by using the etched first resist layer, from which the mask layer has been removed, as a mask, and removing the etched first resist layer to form a predetermined pattern.

2. A process according to claim 1, further comprising the steps of:

forming a second resist layer on the mask layer, patterning the second resist layer, and selectively etching the mask layer by using the second resist layer as a mask.

3. A process according to claim 1, wherein the mask layer is patterned and then the first resist layer is selectively etched by using the patterned mask layer as a mask.

4. A process according to claim 1, wherein the article to be fabricated is one of a polycrystalline silicon layer, a metal layer having a high melting point, and a metal silicide layer having a high melting point.

5. A process according to claim 2, wherein the article to be fabricated is one of a polycrystalline silicon layer, a refractory metal layer and a metal silicide layer having a high melting point.

6. A process according to claim 3, wherein the article to be fabricated is one of a polycrystalline silicon layer, a refractory metal layer and a metal silicide layer having a high melting point.

* * * * *